United States Patent
Connolly et al.

(10) Patent No.: US 10,845,449 B2
(45) Date of Patent: Nov. 24, 2020

(54) METHODS AND APPARATUS FOR MAGNETIC PARTICLE ANALYSIS USING DIAMOND MAGNETIC IMAGING

(71) Applicant: Quantum Diamond Technologies Inc., Somerville, MA (US)

(72) Inventors: Colin B. Connolly, Cambridge, MA (US); Jeffrey D. Randall, Somerville, MA (US); Seabron C. Adamson, Cambridge, MA (US)

(73) Assignee: Quantum Diamond Technologies Inc., Somerville, MA (US)

( * ) Notice: Subject to any disclaimer, the term of this patent is extended or adjusted under 35 U.S.C. 154(b) by 0 days.

(21) Appl. No.: 16/341,207

(22) PCT Filed: Oct. 20, 2017

(86) PCT No.: PCT/US2017/057628
§ 371 (c)(1),
(2) Date: Apr. 11, 2019

(87) PCT Pub. No.: WO2018/075913
PCT Pub. Date: Apr. 26, 2018

(65) Prior Publication Data
US 2019/0317173 A1    Oct. 17, 2019

Related U.S. Application Data

(60) Provisional application No. 62/410,680, filed on Oct. 20, 2016.

(51) Int. Cl.
*G01R 33/60*    (2006.01)
*G01N 24/10*    (2006.01)
*G01R 33/32*    (2006.01)

(52) U.S. Cl.
CPC ............ *G01R 33/60* (2013.01); *G01N 24/10* (2013.01); *G01R 33/323* (2013.01)

(58) Field of Classification Search
CPC ....... G01R 33/60; G01R 33/323; G01N 24/10
(Continued)

(56) References Cited

U.S. PATENT DOCUMENTS 4,279,617 A   7/1981 Masson et al.
4,628,037 A   12/1986 Chagnon et al.
(Continued)

FOREIGN PATENT DOCUMENTS

EP      0430371 A2      6/1991
WO    WO-2008030960 A2  3/2008
(Continued)

OTHER PUBLICATIONS

Shi et al.; "Sensing and atomic-scale structure analysis of single nuclear-spin clusters in diamond"; Pub. Date Nov. 24, 2013; Nature Physics; vol. 10; 21-25 (Year: 2013).*
(Continued)

*Primary Examiner* — Dixomara Vargas
*Assistant Examiner* — Rahul Maini
(74) *Attorney, Agent, or Firm* — Foley Hoag LLP; Rajesh Vallabh

(57) ABSTRACT

The present application discloses methods and apparatus for measuring the arbitrary magnetic response of many individual magnetic particles at once, using a plurality of magnetic images of the magnetic particles acquired over a range of magnetic conditions.

25 Claims, 10 Drawing Sheets

(58) Field of Classification Search
USPC .......................................................... 324/316
See application file for complete search history.

(56) References Cited

U.S. PATENT DOCUMENTS

| | | | |
|---|---|---|---|
| 4,695,392 | A | 9/1987 | Whitehead et al. |
| 5,145,784 | A | 9/1992 | Cox et al. |
| 5,547,555 | A | 8/1996 | Schwartz et al. |
| 5,998,224 | A | 12/1999 | Rohr et al. |
| 6,050,138 | A | 4/2000 | Lynch et al. |
| 6,097,790 | A | 8/2000 | Hasegawa et al. |
| 6,178,033 | B1 | 1/2001 | Ford et al. |
| 6,231,643 | B1 | 5/2001 | Pasic et al. |
| 6,602,714 | B1 | 8/2003 | Tagge et al. |
| 6,896,850 | B2 | 5/2005 | Subramanian et al. |
| 7,086,288 | B2 | 8/2006 | Lee et al. |
| 7,279,286 | B2 | 10/2007 | Kannt et al. |
| 7,474,180 | B2 | 1/2009 | Bintoro et al. |
| 7,489,593 | B2 | 2/2009 | Nguyen-Dinh et al. |
| 7,635,571 | B2 | 12/2009 | Ullman et al. |
| 7,863,035 | B2 | 1/2011 | Clemens et al. |
| 8,142,892 | B2 | 3/2012 | Rida |
| 8,193,808 | B2 | 6/2012 | Fu et al. |
| 8,236,574 | B2 | 8/2012 | Duffy et al. |
| 8,520,211 | B2 | 8/2013 | Schleipen et al. |
| 8,670,524 | B2 | 3/2014 | Mann et al. |
| 8,691,557 | B2 | 4/2014 | Sooryakumar et al. |
| 8,697,435 | B2 | 4/2014 | Heil et al. |
| 8,846,415 | B2 | 9/2014 | Duffy et al. |
| 8,989,354 | B2 | 3/2015 | Davis et al. |
| 9,435,791 | B2 | 9/2016 | Acosta et al. |
| 9,766,181 | B2 | 9/2017 | Englund et al. |
| 9,797,817 | B2 | 10/2017 | McNaughton et al. |
| 2002/0025576 | A1 | 2/2002 | Northrup et al. |
| 2005/0053525 | A1 | 3/2005 | Segal et al. |
| 2006/0252031 | A1 | 11/2006 | Abbott et al. |
| 2007/0012094 | A1 | 1/2007 | Degertekin et al. |
| 2007/0103697 | A1 | 5/2007 | Degertekin |
| 2008/0108122 | A1 | 5/2008 | Paul et al. |
| 2009/0165876 | A1 | 7/2009 | Atkin et al. |
| 2010/0193398 | A1 | 8/2010 | Marsh et al. |
| 2011/0062957 | A1 | 3/2011 | Fu et al. |
| 2011/0065209 | A1 | 3/2011 | Heil et al. |
| 2011/0124985 | A1 | 5/2011 | Meurville et al. |
| 2011/0170108 | A1 | 7/2011 | Degertekin |
| 2012/0115214 | A1 | 5/2012 | Battrell et al. |
| 2012/0170134 | A1 | 7/2012 | Bolis et al. |
| 2012/0182548 | A1 | 7/2012 | Harb et al. |
| 2013/0122485 | A1 | 5/2013 | Hong |
| 2013/0122517 | A1 | 5/2013 | Henzler et al. |
| 2015/0184235 | A1 | 7/2015 | Reda et al. |
| 2015/0374250 | A1* | 12/2015 | Hatano ................ G01R 33/032 600/409 |
| 2016/0282427 | A1 | 9/2016 | Heidmann |
| 2016/0356863 | A1* | 12/2016 | Boesch ................ G01R 33/032 |
| 2017/0234941 | A1 | 8/2017 | Hatano et al. |
| 2017/0316487 | A1 | 11/2017 | Mazed |

FOREIGN PATENT DOCUMENTS

| | | |
|---|---|---|
| WO | WO-2010051580 A1 | 5/2010 |
| WO | WO-2011/026030 A1 | 3/2011 |
| WO | WO-2011133632 A1 | 10/2011 |
| WO | WO-2013004852 A2 | 1/2013 |
| WO | WO-2013059404 A1 | 4/2013 |
| WO | WO-2014/108185 A1 | 7/2014 |
| WO | WO-2015/199940 A1 | 12/2015 |
| WO | WO-2016/118791 A1 | 7/2016 |
| WO | WO-2018119367 A1 | 6/2018 |
| WO | WO-2019/027917 A1 | 2/2019 |

OTHER PUBLICATIONS

Lai et al.; "Influence of a static magnetic field on the photoluminescence of an ensemble of nitrogen-vacancy color centers in a diamond single-crystal"; Sep. 28, 2009; Applied Physics Letters; 95, 133101; 1-3 (Year: 2009).*

Glenn et al., "Single-cell magnetic imaging using a quantum diamond microscope," Nature Methods, 12:736-738 (2015).

Hong et al., "Nanoscale magnetometry with NV centers in diamond," MRS Bulletin, 38:155-161 (2013).

Pham, "Magnetic Field Sensing with Nitrogen-Vacancy Color Centers in Diamond," Harvard University, Doctoral Dissertation (2013).

Taylor et al., "High-sensitivity diamond magnetometer with nanoscale resolution," Nature Physics, 4:810-816 (2008).

Le Sage et al., "Optical magnetic imaging of living cells," Nature, 496:486-489 (2013).

Interntional Search Report and Written Opinion for PCT/US2017/027628, dated Jan. 19, 2018.

Extended European Search Report for EP Application No. EP 17861549 dated Oct. 10, 2019.

Rondin et al., "Magnetometry with nitrogen-vacancy defects in diamond," Reports on Progress in Physics, 77(5):56503 (2014).

Schonfeld, "Optical readout of single spins for quantum computing and magnetic sensing," Fachbereich Physik der Freien Universitat Berlin eingereichte Dissertation 1-143 (2011).

Extended European Search Report for EP Application No. 17884358.7 dated Jun. 22, 2020.

International Search Report and Written Opinion for International Application No. PCT/US2018/044409 dated Nov. 16, 2018.

* cited by examiner

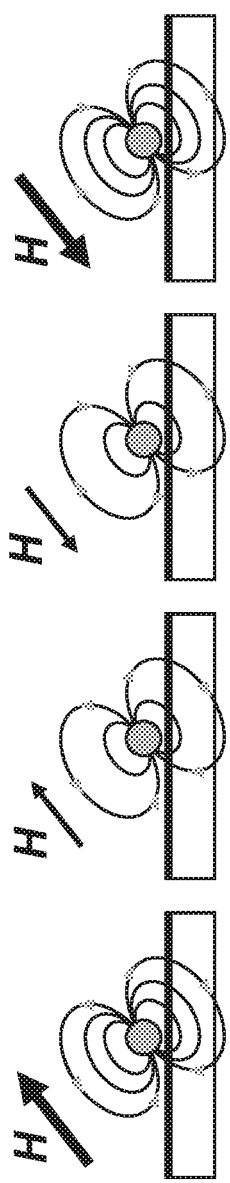
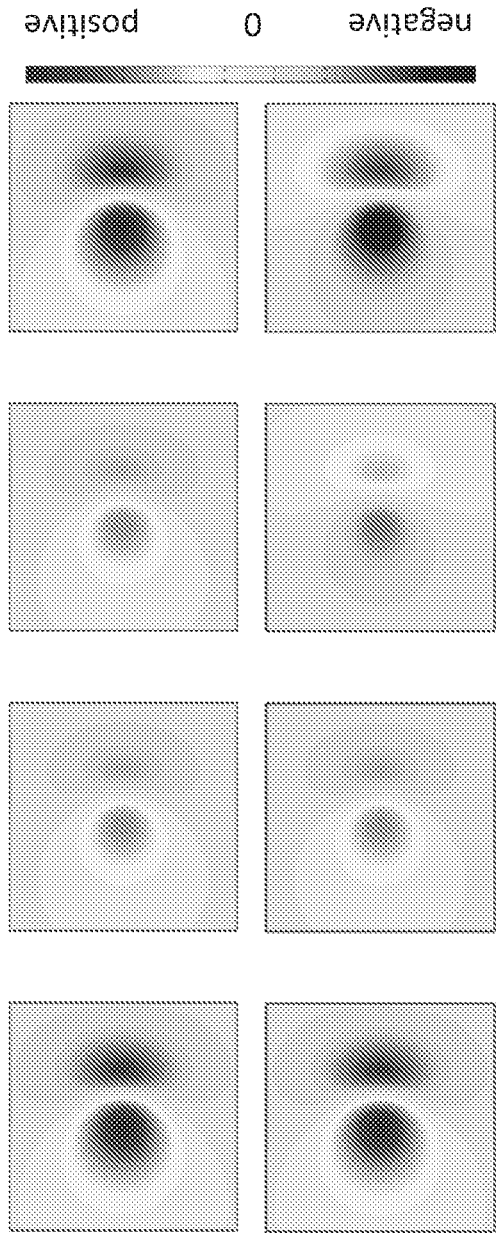
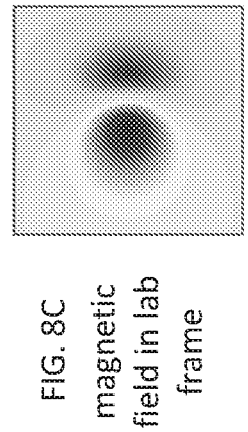
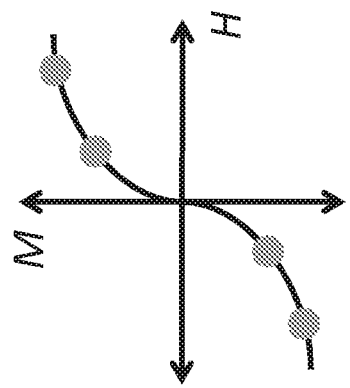
FIG. 8A
FIG. 8B magnetic field images
FIG. 8C magnetic field in lab frame
FIG. 8D

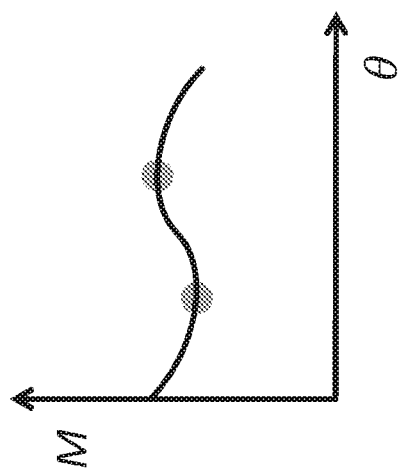
FIG. 9C
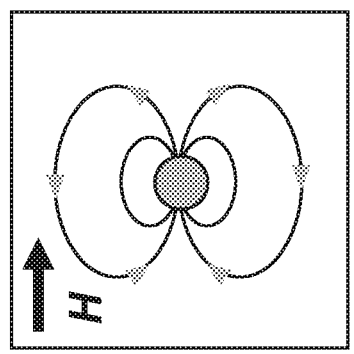
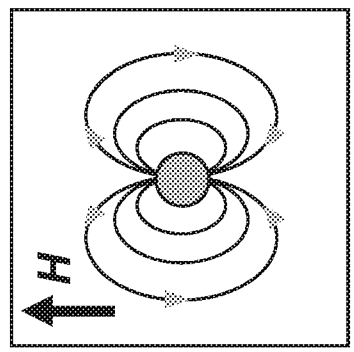
FIG. 9A
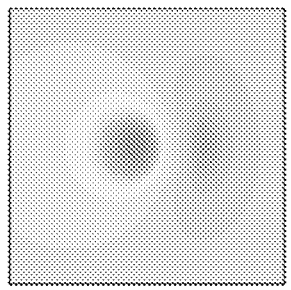
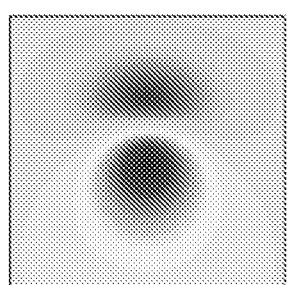
FIG. 9B
magnetic field images
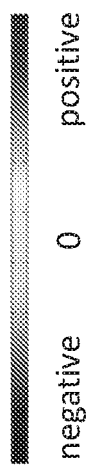

METHODS AND APPARATUS FOR MAGNETIC PARTICLE ANALYSIS USING DIAMOND MAGNETIC IMAGING

CROSS REFERENCE TO RELATED APPLICATION

This application is the U.S. national phase of International Patent Application No. PCT/US17/57628 filed on Oct. 20, 2017 entitled METHODS AND APPARATUS FOR MAGNETIC PARTICLE ANALYSIS USING WIDE-FIELD DIAMOND MAGNETIC IMAGING, which claims the benefit of U.S. Provisional Patent Application No. 62/410,680 filed on Oct. 20, 2016 entitled METHODS AND APPARATUS FOR MAGNETIC PARTICLE ANALYSIS USING DIAMOND MAGNETIC IMAGING, both of which applications are hereby incorporated by reference in their entirety.

BACKGROUND

Magnetic particles and particle-matrix composite beads have widespread applications in fields including medical diagnostics and therapy, life sciences research, environmental remediation, and power electronics. Each application of magnetic particles depends on a particular set of particle properties, which notably include magnetic properties such as magnetic susceptibility, magnetic remanence, and magnetic anisotropy. Successful use of magnetic particles depends on reliable analytical tools to develop new or improved particles and to perform quality control.

While technologies for magnetic particle analysis are commercially available, they do not allow for general analysis of magnetic properties of single particles with high-throughput. Ensemble measurements such as vibrating sample magnetometry (VSM) measure magnetic properties only over a macroscopic sample of particles, averaging over any variation within the ensemble. Conversely, single-particle measurement technologies such as electron holography or scanning magnetometry cannot provide the sensitivity and throughput required for industrial quality control. Additional niche technologies such as magnetophoretic velocimetry can probe single particles rapidly to measure a certain subset of magnetic properties, but are not general-purpose tools capable of addressing the disparate needs across the many applications of magnetic particles.

BRIEF SUMMARY

A method of determining properties of magnetic particles using wide-field diamond magnetic imaging in accordance with one or more embodiments comprises the steps of: (a) generating a set of magnetic images of a plurality of magnetic particles positioned on or near to a sensing surface of a diamond sensor under different magnetic conditions; and (b) analyzing the set of magnetic images to infer magnetic properties of individual magnetic particles in the plurality of magnetic particles.

In accordance with one or more embodiments, the magnetic properties include magnetic remanence, and wherein step (a) comprises reversing a magnetizing field applied to the magnetic particles to create the different magnetic conditions.

In accordance with one or more embodiments, step (a) comprises: (1) applying a magnetic bias field on the plurality of magnetic particles positioned on the sensing surface; (2) illuminating nitrogen-vacancy (NV) centers in the sensing surface with green light; (3) applying a microwave field to the sensing surface with frequency near one of the NV center electronic spin resonance (ESR) transitions; (4) acquiring an image of NV center fluorescence emitted from the sensing surface; (5) repeating steps (3) and (4) a plurality of times using different microwave frequencies that span one or more ranges around one or more NV center ESR transitions to generate the set of magnetic images, each corresponding to a different microwave frequency.

In accordance with one or more embodiments, the method, further comprises: (6) repeating steps (3)-(5) a plurality of times and averaging the results to reduce imaging noise in the set of images.

In accordance with one or more embodiments, step (a) comprises: (1) acquiring a set of NV center fluorescence images of the magnetic particles positioned on the sensing surface; (2) constructing an electronic spin resonance (ESR) spectrum for each image pixel in the set of NV center fluorescence images; (3) analyzing the ESR spectrum for each image pixel to determine the frequencies of one or more ESR transitions; (4) computing the magnitude and/or direction of the magnetic field for each image pixel based on the frequencies of observed ESR transitions at that pixel to produce a magnetic image from the set of NV center fluorescence images; and (5) repeating steps (1)-(4) to produce each magnetic image in the set of magnetic images.

A system for determining properties of magnetic particles in accordance with one or more embodiments comprises: an apparatus for generating a set of magnetic images of a plurality of magnetic particles positioned on or near a sensing surface of a diamond sensor under different magnetic conditions; and a computer system for analyzing the set of magnetic images to infer magnetic properties of individual magnetic particles in the plurality of magnetic particles.

In accordance with one or more embodiments, the apparatus comprises: a diamond imaging sensor with a sensing surface containing a layer of diamond nitrogen-vacancy (NV) centers on which the magnetic particles can be positioned; a source of excitation light for inducing NV center fluorescence at the sensor surface; at least one magnet for applying a bias magnetic field on the magnetic particles; a microwave source for applying a microwave field to the sensing surface; and an optical imaging system having an imaging sensor to image the NV center fluorescence from the sensor surface.

BRIEF DESCRIPTION OF THE DRAWINGS

FIGS. 8A-8D schematically illustrate an exemplary process for measuring particle magnetization in accordance with one or more embodiments.

FIGS. 9A-9C schematically illustrate an exemplary process for measuring magnetic anisotropy in accordance with one or more embodiments.

DETAILED DESCRIPTION

Various embodiments disclosed herein relate to methods and apparatus for magnetic particle analysis using wide-field diamond magnetic imaging. Wide-field diamond magnetic imaging is a method of imaging magnetic fields at the sensing surface of a diamond imaging sensor. In this method, magnetic fields are constructed from one or more images of fluorescence from a plurality of nitrogen-vacancy (NV) centers in the diamond imaging sensor. Each optical image is obtained using an optical imaging system to acquire NV fluorescence from many or all points in the field of view simultaneously.

Such imaging using the NV centers in diamond can provide the diverse capabilities needed for high-throughput analysis of single magnetic particles. Each particle's magnetic field can be directly measured, allowing for a general measurement of the particle's magnetic response. Many particles (e.g., thousands of particles) can be individually analyzed simultaneously in minutes with high precision, allowing high throughput analysis of the entire magnetic particle distribution.

Figure 1:
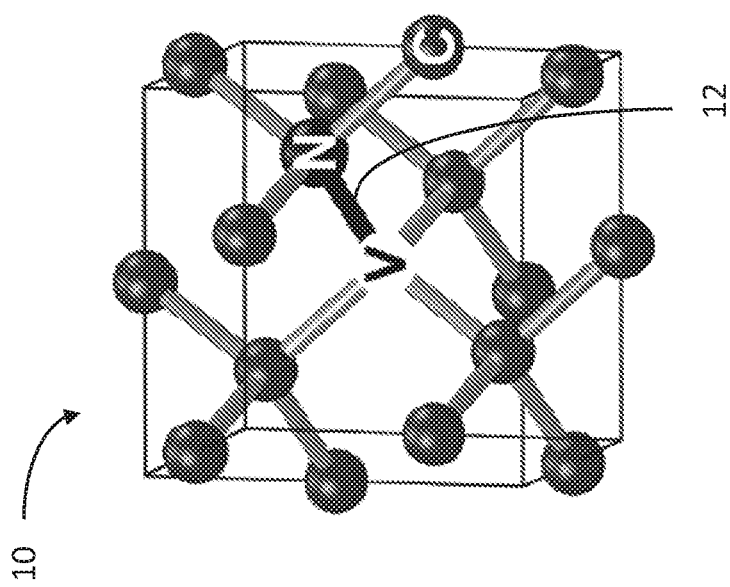
FIG. 1 schematically illustrates a diamond crystal structure showing a nitrogen-vacancy center structure in a lattice of carbon atoms.

FIG. 1 schematically shows a diamond crystal structure 10 showing a nitrogen-vacancy center (N and V) structure amid lattice of carbon (C) atoms. The NV axis is oriented along the bond 12.

As described in further detail below, the particle analysis process involves acquiring a set of magnetic images under a series of magnetic conditions for a field of view containing one or many magnetic particles. The set of magnetic images are then interpreted to infer the particles' magnetic response.

Wide-field magnetic imaging using NV centers in diamond ("wide-field diamond magnetic imaging") is a known technique that can be used to obtain images of magnetic fields with sub-micron spatial resolution and sub-micro Tesla sensitivity over single image pixels. Some researchers have used wide-field diamond magnetic imaging to observe magnetic fields produced by magnetic nanoparticles or beads. In one case, wide-field diamond magnetic imaging was used in order to detect and count magnetic nanoparticles. In another case, single magnetic images of magnetic beads were acquired and analyzed to extract the beads' magnetic dipole moment under particular experimental conditions.

In accordance with one or more embodiments, methods and apparatus are disclosed for general magnetic analysis of magnetic particles using wide-field diamond magnetic imaging. A magnetic particle responds to a magnetic field by developing a magnetization specific to the particle's properties. The particle magnetization depends on the magnitude, direction, and time profile of the applied field, as well as the proximity of the particle to other particles. The particle's magnetic properties can be determined by applying arbitrary magnetizing fields and observing the particle's magnetization in response.

Wide-field diamond magnetic imaging in accordance with one or more embodiments provides a detailed quantitative picture of a particle's magnetic field, and can do so over a wide range of applied magnetic field magnitudes and directions, both static and time-varying. By acquiring a set of images under different magnetic conditions, complex magnetic properties of all particles in the image field of view can be determined, including magnetic remanence, coercivity, and magnetic relaxation time that cannot be determined from a single image.

Wide-Field Diamond Magnetic Imaging

Magnetic sensing with NV centers uses NV center fluorescence to probe the NV center electronic spin, which is influenced by the local magnetic field. Briefly, ESR transitions between spin states are observed through changes in the brightness of NV center fluorescence in response to a resonant microwave-frequency field. The frequencies at which these transitions occur reveal the vector magnetic field at the location of the NV center. For high-sensitivity sensing, many NV centers within a small sensing volume can be probed simultaneously, resulting in a proportionally larger fluorescence signal.

Figure 2:
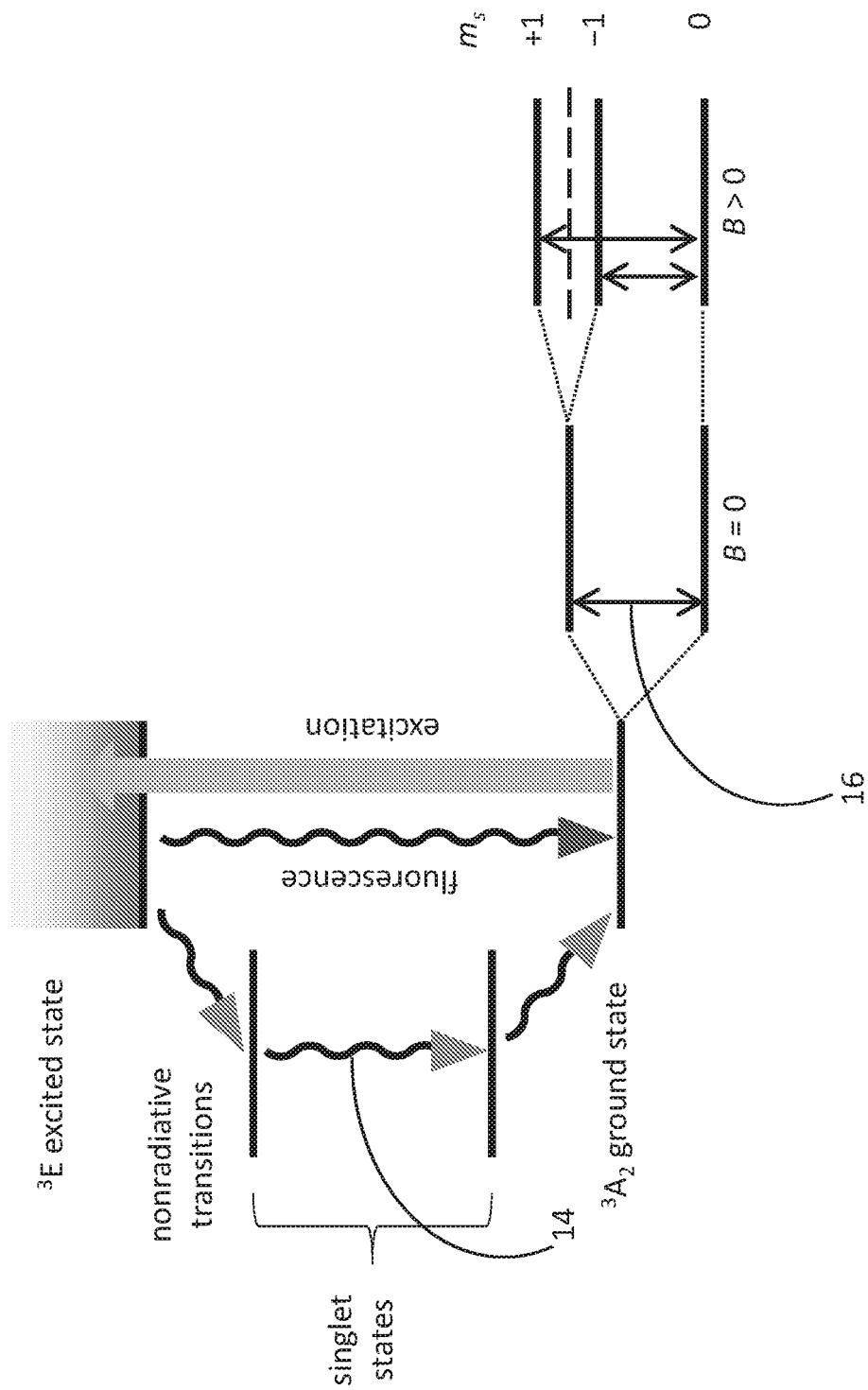
FIG. 2 illustrates an exemplary NV center energy level diagram.

FIG. 2 depicts an energy level diagram showing optical transitions between ground and excited spin-triplet states, with ground state electronic spin sublevels shown. Also shown is a non-radiative path (gray arrows 14) through metastable singlet states that provides spin-dependent excited state decay that optically polarizes the NV ground state to the $m_s=0$ spin sublevel, where $m_s$ is the spin projection quantum number. At zero magnetic field, the $m_s=\pm 1$ sublevels are separated from the $m_s=0$ sublevel by the zero-field splitting $D \approx 2.88$ GHz. In a nonzero magnetic field, B, these levels are no longer degenerate and experience opposite magnetic Zeeman shifts. The magnetic shifts of the spin levels can be probed by ESR transitions (black arrows 16).

Wide-field diamond magnetic imaging performs magnetic measurements as described above, but does so simultaneously over all points within the imaging field of view. The diamond sensor contains NV centers in a thin layer at the imaging surface. The magnetic image obtained is a measurement of the magnetic field sensed by the NV centers contained within the thin layer of NV centers. There may be an additional buffer layer between the NV layer and the magnetic sample to be imaged. The buffer layer may serve a technical function—such as supporting the sample, dispersing the sample, or facilitating changing between samples—without significantly affecting the magnetic field.

Figure 3:
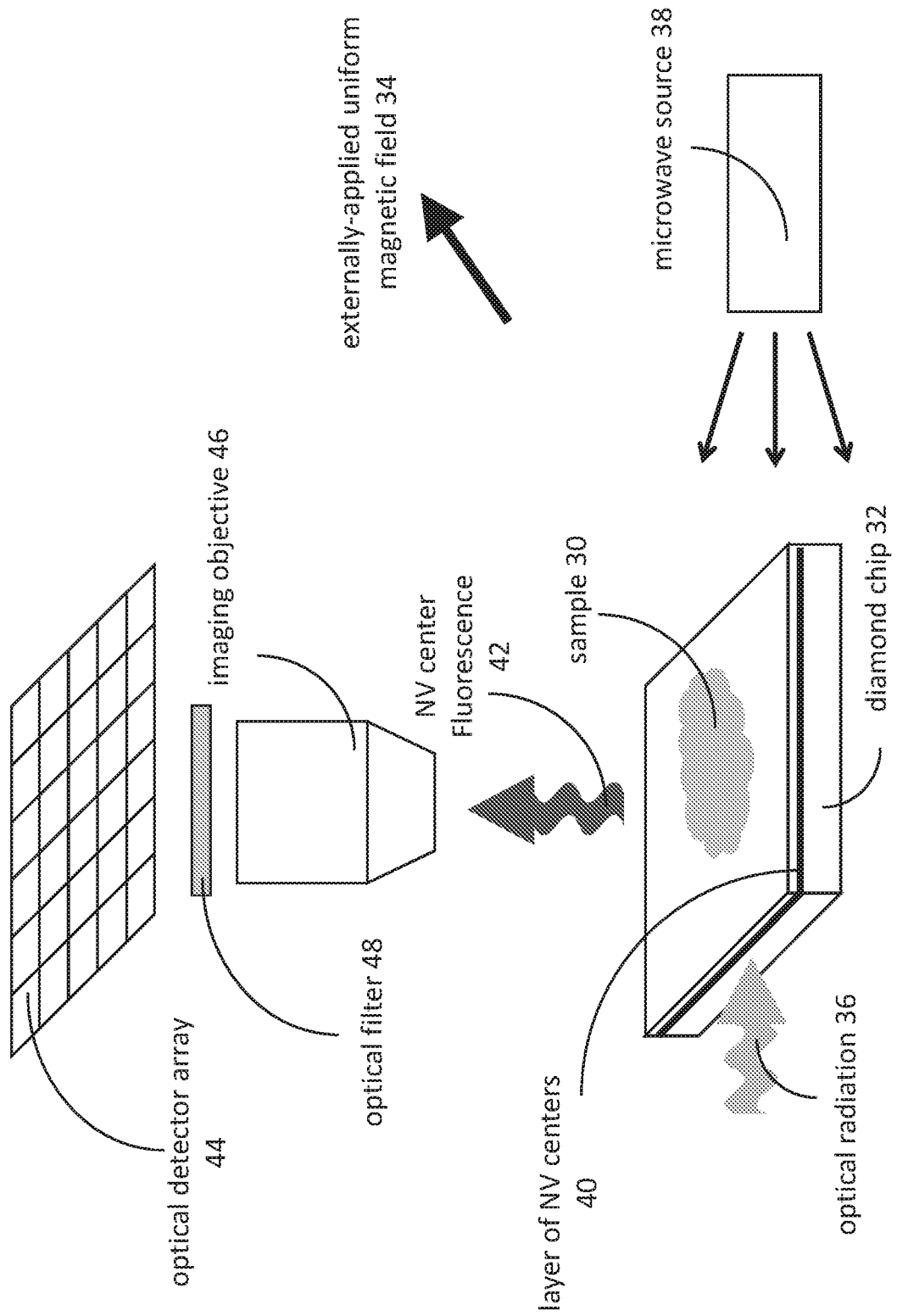
FIG. 3 schematically illustrates an exemplary wide-field diamond magnetic imaging apparatus in accordance with one or more embodiments.

FIG. 3 is a schematic of an exemplary apparatus used for wide-field diamond magnetic imaging in accordance with one or more embodiments. Under optical excitation, fluorescence from a thin layer of NV centers near the diamond surface is imaged onto an optical detector array, such as a charge-coupled device (CCD) or complementary metal oxide semiconductor (CMOS) camera. The variation of NV center fluorescence under microwave excitation reveals the NV ESR frequency, and hence the magnetic field shift of the NV spin sublevels. The spatial structure of the magnetic field at the diamond surface created by the sample can thus be determined from images of NV center fluorescence.

Briefly, the process to acquire a magnetic image is as follows:

1. Introduce a magnetic sample 30 to be imaged onto or near to the sensing surface of the diamond sensor 32.

2. Apply a magnetic bias field 34 in an arbitrary direction.

3. Illuminate the NV centers 40 in the diamond center with green light 36 (near 532 nm wavelength).

4. Apply a microwave field from a source 38 to the diamond, with frequency near one of the NV center ESR transitions.

5. Acquire an image of NV center fluorescence 42 emitted from the sensing surface at optical detector array 44.

6. Repeat steps 4-5 using different microwave frequencies that span one or more ranges around one or more NV center ESR transitions. The result is a stack of images, each corresponding to a different microwave frequency.

7. Repeat steps 4-6 one or more times, averaging the results to reduce imaging noise in the image stack.

Figure 5:
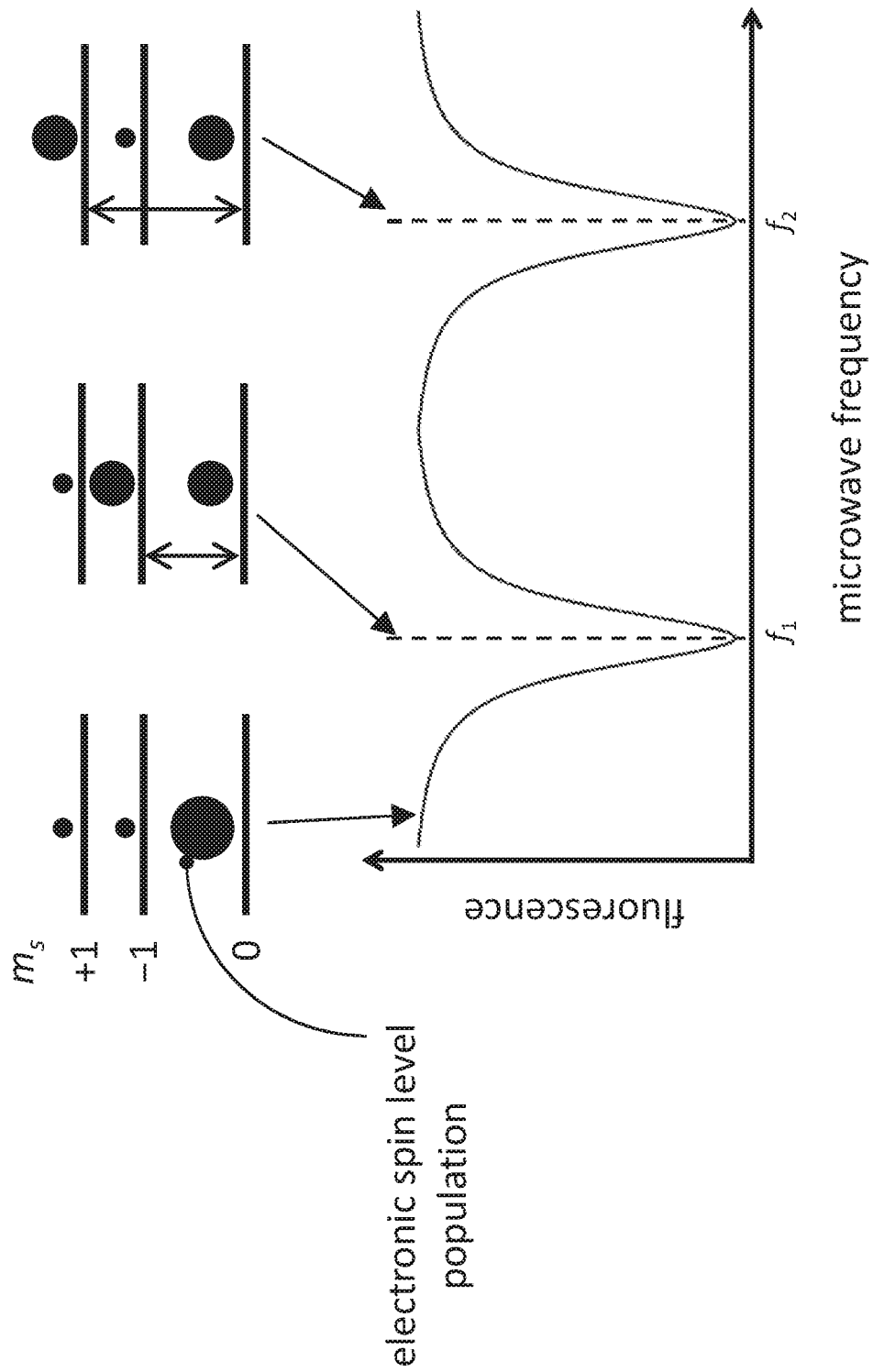
FIG. 5 schematically illustrates an exemplary ESR spectrum.
Figure 6:
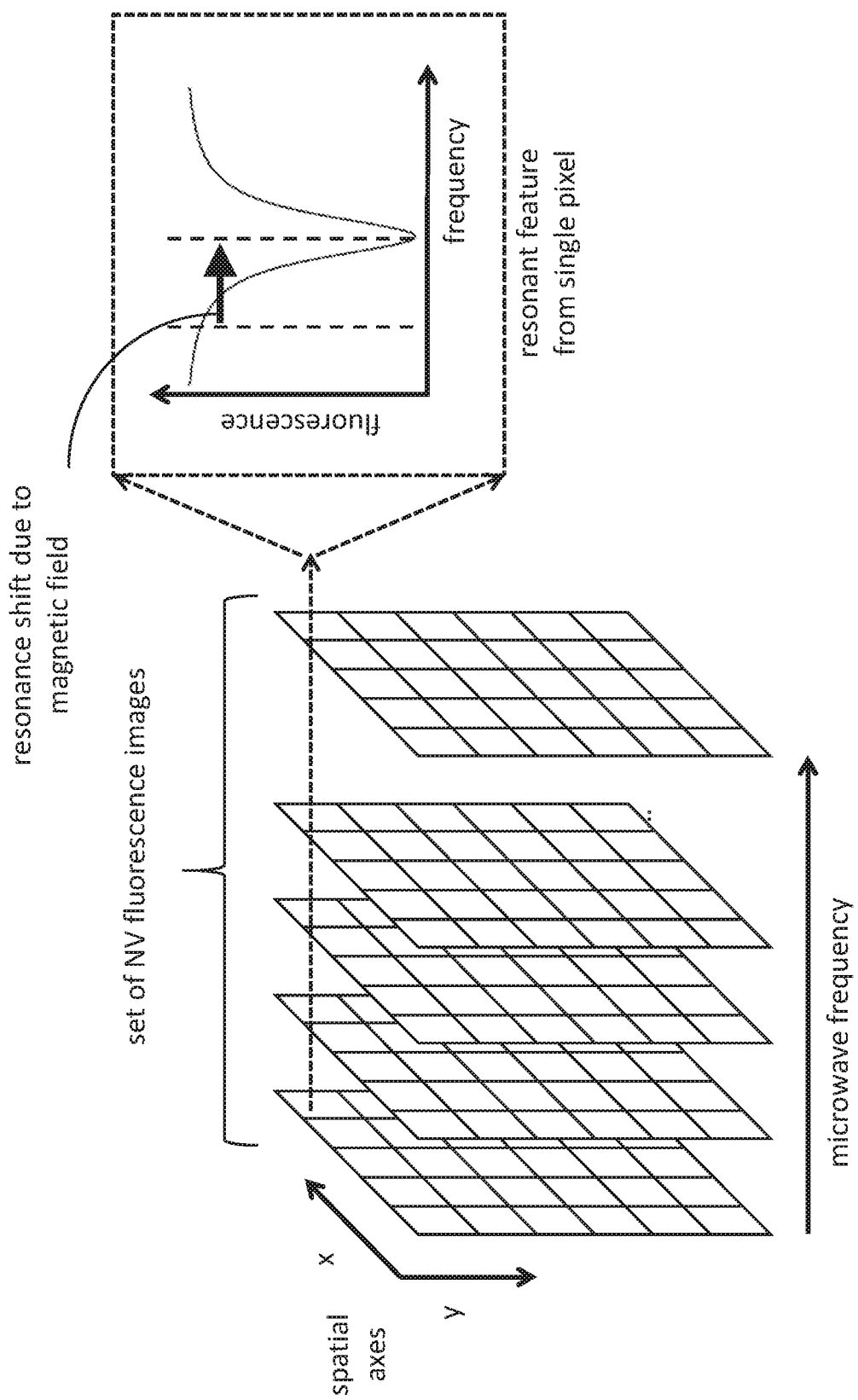
FIG. 6 schematically illustrates exemplary image processing in accordance with one or more embodiments.

8. For each image pixel in the image stack, construct an ESR spectrum from that pixel's value across all images in the stack (FIGS. 5 and 6). Analyze this spectrum to determine the frequencies of one or more ESR transitions.

9. For each image pixel in the image stack, compute the magnetic field based on the frequencies of observed ESR transitions at that pixel.

Figure 4:
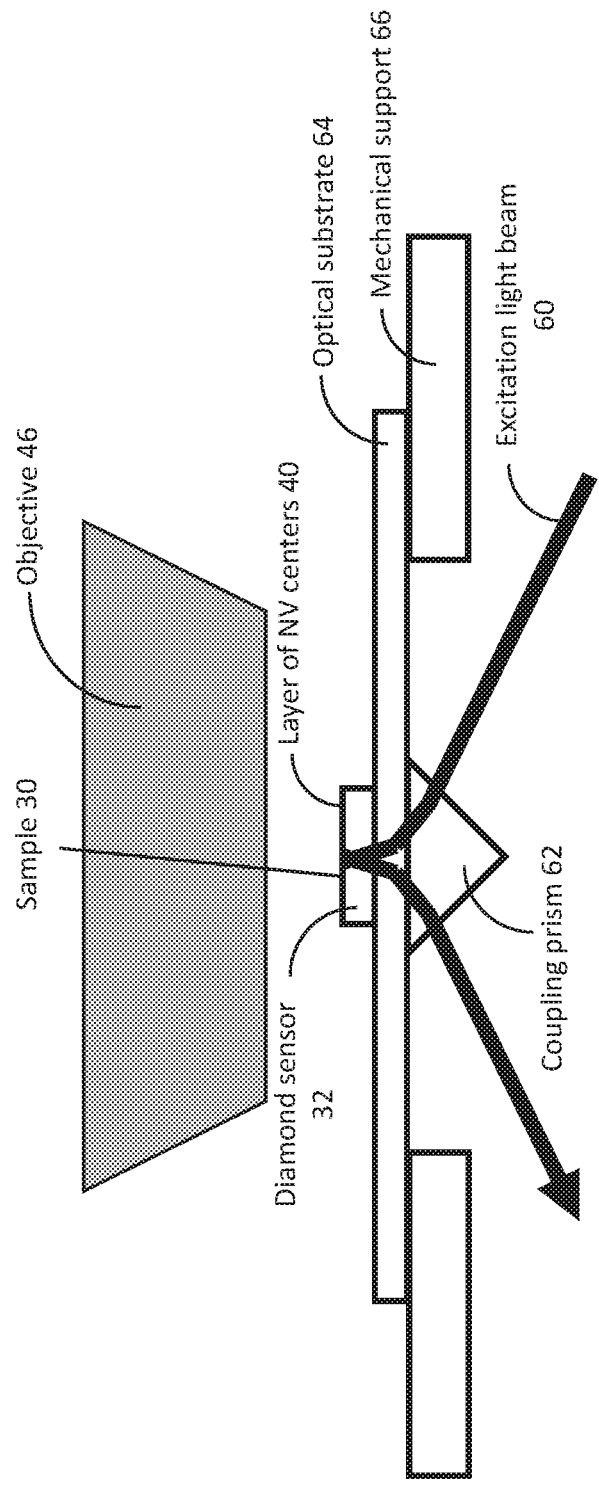
FIG. 4 schematically illustrates a portion of an exemplary wide-field diamond magnetic imaging apparatus in accordance with one or more alternate embodiments.

FIG. 4 schematically shows a portion of an exemplary imaging apparatus in accordance with one or more embodiments, illustrating an alternative technique of optical excitation of NV centers 40 in the diamond sensor 32. The excitation light beam 60 is directed to the sensing surface by optical elements 62 with surfaces angled with respect to the sending surface, such that the excitation light beam 60 undergoes total internal reflection (TIR). The diamond sensor 32 is supported on an optical substrate 64, which may be thermally conductive to dissipate sensor heat. The optical substrate 64 may be mounted on a mechanical support 66.

As shown in FIG. 5, the ESR spectrum is probed by sweeping the frequency of a microwave drive field during or after optical excitation. Upon optical excitation, spin-dependent decay from the excited state causes the NV center electronic spin to become partially or fully polarized into the $m_s=0$ spin level. When the microwave drive is resonant with an ESR transition between spin levels, the population is driven instead to the $m_s=+1$ or $-1$ state. The spin-dependent excited state decay causes the $m_s=0$ and $m_s=\pm 1$ states to yield different fluorescence rates, so driving population from the $m_s=0$ level causes a resonant dip in fluorescence.

FIG. 6 illustrates an exemplary procedure for obtaining magnetic field images from a set of NV center fluorescence images. A NV center ESR spectrum is obtained from the set at each pixel, and this spectrum is analyzed to determine locations of ESR peaks. The shift of these peaks (shown here as a single resonance peak, although it may be several peaks depending on the hyperfine structure and background spin environment of the NV center) reveals the local magnetic field in that pixel.

Wide-Field Diamond Magnetic Imaging of Magnetic Fields from Magnetic Particles

Figure 7A:
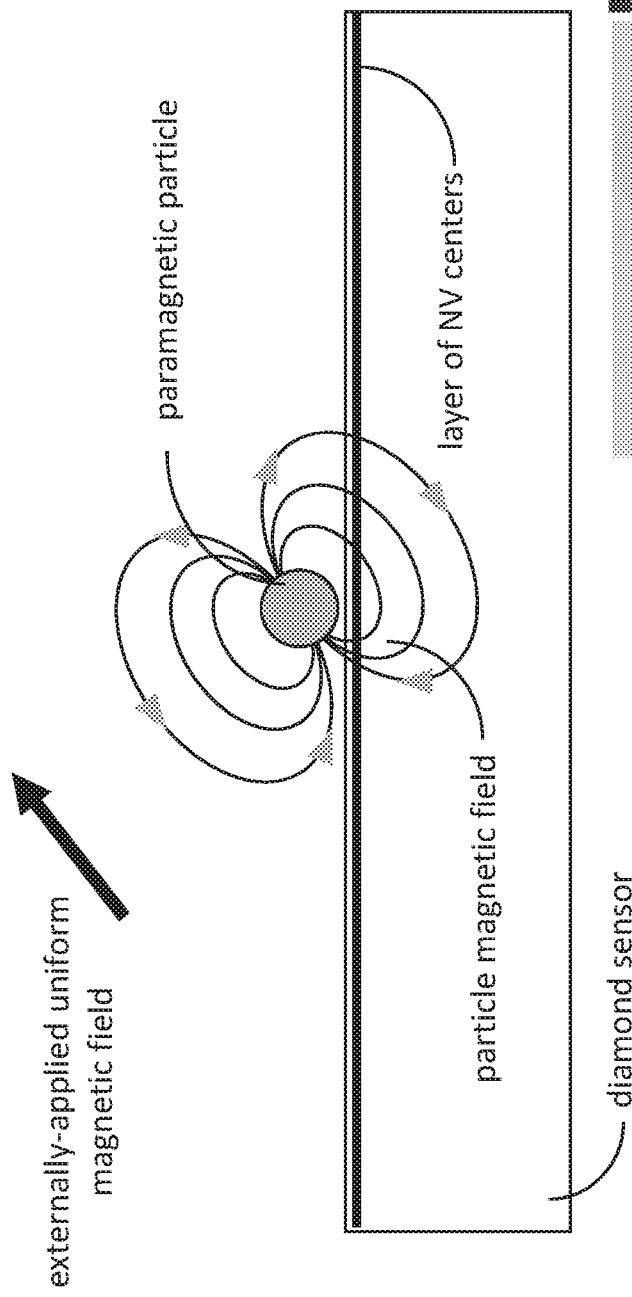
FIGS. 7A and 7B schematically illustrate exemplary imaging of magnetic particles in accordance with one or more embodiments.
Figure 7B:
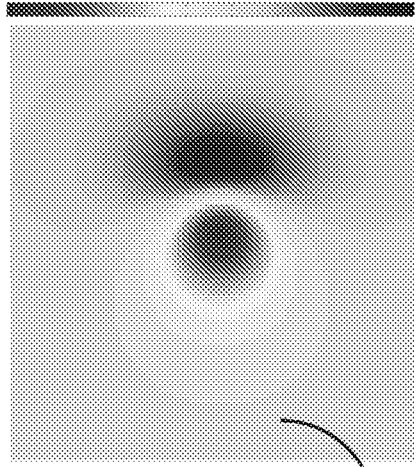

When a magnetic object in a test sample is imaged on or near the diamond surface, the object's induced magnetization modifies the magnetic field in the thin layer of NV centers at the diamond surface (FIGS. 7A and 7B). After imaging, the known contribution from the externally applied bias field is subtracted to leave behind an image of the object's magnetic field contribution, referred to hereafter as the magnetic image. We assume for this discussion that the magnetic object is a magnetic particle or a composite magnetic bead comprised of one or more types of magnetic material and a nonmagnetic matrix. The test sample is assumed to be an ensemble of particles distributed over or near the sensor surface.

FIG. 7A schematically shows a magnetic particle on the surface of the diamond sensor. In this example, the applied magnetic bias field is aligned with one of the four diamond crystal axes. This field polarizes the magnetic particle to produce a dipole-like field. The image shown in FIG. 7B is a simulation of the projection of a magnetic dipole field onto the NV axis in the plane of the NV centers.

A particle's magnetic response to applied fields can be determined by changing the magnetic field conditions and acquiring a set of images (FIGS. 8 and 9). Since the magnetic image provides a direct measure of the particle's magnetic field, the magnetic response is probed directly, rather than inferred from other properties.

FIGS. 8A-8D illustrate an exemplary procedure for measuring particle magnetization along a single axis. The applied magnetizing field, H, is varied in magnitude and inverted (FIG. 8A), during which several magnetic images (FIG. 8B) are acquired. These images are transformed back into the lab frame (FIG. 8C), and then analyzed to obtain the particle magnetization, M, for each value of H, yielding the single-axis magnetization curve (FIG. 8D). In this example H is applied parallel to one of the four diamond crystal axes.

FIGS. 9A-9C illustrate an exemplary procedure for measuring a particle's magnetic anisotropy. As shown in FIG. 9A, the applied magnetizing field, H, is applied in different directions, during which several magnetic images (FIG. 9B) are acquired. These images are analyzed to obtain the particle magnetization, M, for each angle, θ, that H is applied (FIG. 9C).

Measuring Magnetic Particle Properties

A magnetic image of a magnetic particle provides information on the magnitude and spatial distribution of magnetization in the particle. Furthermore, analyzing a sequence of magnetic images acquired under different imaging conditions to quantify the particle magnetization provides more complete information of the particle's magnetic response.

For example, the magnitude of the externally-applied magnetic field can be varied in strength and reversed in direction to measure a single-particle single-axis magnetization curve. Here the particle is subjected to a magnetic field applied along a certain axis with magnitude varied in this sequence: monotonically increasing to a maximum value, then reduced back to zero, then monotonically increasing along the same axis in the opposite direction to a maximum value, then reduced back to zero. Magnetic hysteresis is observed when the curves measured for increasing and decreasing magnetic field do not overlap, making the magnetization curve a closed loop. Magnetic images may be acquired arbitrarily at any point in this process, such that an entire magnetization curve or hysteresis loop may be determined. Hysteresis loops may be acquired for different values of maximum magnetization to study magnetization and demagnetization processes.

The slope of the magnetization curve or hysteresis loop is the magnetic susceptibility, which may take different values at different points along the curve. The susceptibility may be measured at any point on the curve by acquiring multiple images with slightly different magnitude of applied magnetic field. The initial susceptibility, the susceptibility measured for an unmagnetized sample at very low applied field magnitude, can be determined in addition to the behavior after magnetization. The magnetization curve also gives the saturation magnetization (maximum magnetization), remanent magnetization (the magnetization after the magnetic field is reduced to zero), and magnetic coercivity (the magnetic field required to reduce the magnetization to zero).

Single-axis magnetization curves can also be obtained along additional axes to probe anisotropy of the single-particle magnetization curve. In addition, magnetization along one axis can be measured while the magnetic field is applied and varied along another axis.

Alternating or rotating magnetic fields may be used to induce time-varying particle magnetization. Imaging the time-varying magnetization can be accomplished by using camera exposure times shorter than the field oscillation period. This method produces snapshots of the magnetization oscillation at different phase points. Alternately, exposure times longer than the oscillation period can be used if the light used for optical excitation of the NV centers is delivered in pulses that are phase matched to the oscillation, but shorter than its period. The entire magnetization oscillation can be mapped by acquiring images with different pulse phase. An additional approach is to use a lock-in camera that performs a lock-in measurement at each pixel, such that the output image reflects only the component of the fluorescence signal that oscillates at a specific frequency, which may be the frequency of the oscillating magnetizing field.

The single-particle magnetic properties measured may comprise a superposition of multiple magnetic components or phases. Especially in the case of magnetic beads comprising many magnetic nanoparticles, there can be a range of magnetic properties represented in the single-bead properties. In this case, wide-field diamond magnetic imaging may provide additional information into the spatial distribution of different magnetic components within a single bead. This can be observed in variations in the particle magnetic field contours as the magnetic properties listed above are measured.

The magnetic properties measured may comprise the thermal variation of the magnetic particle, the amount by which the magnetic properties vary with changing temperature. Many magnetic materials exhibit reduced magnetization with increasing temperature, with the magnetization returning to the original value when the temperature increase is reversed. In an exemplary case, a particle may be repeatedly imaged at different temperatures under identical magnetic conditions to track the variation of magnetic properties with temperature.

The magnetic properties measured may comprise the Curie temperature, above which the particles do not exhibit ferromagnetism, ferrimagnetism, or other magnetic order in the absence of an applied magnetic field. In an exemplary case, a ferromagnetic particle may be magnetized at one temperature and then repeatedly imaged at low magnetic field at successively higher temperatures until the remanent magnetization vanishes. The Curie temperature is the temperature at which this transition to zero remanent magnetization is observed.

As the imaging field of view may be much larger than a magnetic particle, many particles may be imaged simultaneously without additional image acquisition time. Camera sensors containing several million pixels are in common use, allowing 10,000 to 100,000 particles to be imaged simultaneously with tens or hundreds of adjacent pixels available to resolve each particle. For a given camera sensor, the imaging system magnification may be chosen to balance imaging resolution against image field of view. An exemplary 4-megapixel camera with 1-cm sensor may provide 500-nm pixels over a 1-mm$^2$ field of view.

Magnetic images may be obtained using wide-field diamond magnetic imaging in seconds or minutes, depending on the magnetic sensitivity required. Magnetic properties described above may be determined from a set of several images, such that the total data acquisition time may be only several minutes. With many particles in the field of view, the throughput for magnetic particle analysis may be thousands of particles per minute, a scale appropriate for quality control in particle manufacturing and by end users. Additional particles in additional fields of view may be subsequently analyzed by mechanically translating the field of view, either on the same diamond sensor or an additional sensor. Millions of particles in total may be analyzed in this manner within several hours. Analysis of large particle distributions gives greater statistical precision and higher sensitivity to rare outliers Exemplary Analysis Apparatus An exemplary magnetic particle analysis apparatus in accordance with one or more embodiments includes the following components:

1. A diamond imaging sensor 32 with an imaging surface that contains a layer of NV centers 40. This layer 40 may be 10 nm to 10 μm thick, with optimal thickness similar to the optical imaging resolution of the optical imaging system (near 1 micron). Thicker NV layers can contain more NV centers, boosting the signal strength and imaging speed; thinner layers ensure that all NV centers are close to the sample, where magnetic fields may be largest. The NV center concentration should be 1-100 ppm for optimal performance; lower concentrations sacrifice NV signal, while higher concentrations may reduce NV spin coherence and hence magnetic sensitivity.

2. A source of excitation light 36 within the NV center visible absorption band for inducing NV center fluorescence 42. Laser light near 532-nm wavelength provides watt-scale power with relatively high power efficiency and relatively low cost. Coherent excitation light is not required; an LED or other incoherent source is sufficient, and may be desired to reduce optical interference. Excitation light intensity near 1 W/mm$^2$ is sufficient to optically polarize NV centers and provide significant signal fluorescence with only modest heating. The excitation light may have an intensity between 0.01 W/mm$^2$ and 100 W/mm$^2$.

3. An optical imaging system 46 to image NV center fluorescence from the sensor surface. The imaging system 46 includes an objective lens with numerical aperture suitable to provide high spatial resolution. For resolution near 1-micron, the numerical aperture should be at least 0.5. A second lens focuses image light onto an imaging sensor such as a CCD or CMOS pixel array 44. Optical filters 48 may be used to block excitation light and other unwanted background light, while passing NV fluorescence in a band of approximately 650-800 nm. The imaging system should correct for spherical aberration and chromatic aberration to provide high resolution for signal light over the entire field of view.

4. Bias magnetic field 34 with sufficient magnitude, at least approximately 10 G, to spectrally resolve magnetic field-shifted ESR transitions among NV centers aligned along different diamond crystal axes. This bias field can also be used to induce a magnetic response in the particles under study.

5. Microwave field resonant with one or more NV center ESR transitions near 2.87 GHz, with sufficient intensity to induce observable changes in NV center state populations. The microwave field may be generated using a wire, a printed planar circuit, transmission line, or other conductor geometry. The circuit may be constructed as a resonator to provide high intensity with low input power, or remain broadband for greater frequency flexibility, which corresponds to greater flexibility for the bias magnetic field magnitude and direction.

6. The apparatus may include the following additional apparatus features that enable magnetic particle analysis:
7. The bias magnetic field direction may be chosen to have equal projection onto two or more crystal axes of the diamond in order to overlap peaks in the ESR spectrum corresponding to different NV center orientations. This may provide greater signal contrast by superimposing multiple ESR peaks. In such cases, the apparent width of the spectral feature resulting from overlapping multiple peaks may be used to quantify differential frequency shifts among those peaks.
8. Confining the NV center excitation light to within the diamond crystal prevents exposing the particles under study to the excitation light and helps avoid or mitigate unwanted effects arising from photosensitivity or particle heating. The excitation light may be directed into the diamond such that it impinges on the sensing surface at an angle that results in total internal reflection (TIR) at that surface and does not propagate through the particles under study.
9. An optical assembly containing the diamond may feature angled optical interfaces for directing excitation light into the diamond at an angle appropriate for TIR.
10. Heating of the diamond sensor may result from excitation light, microwave radiation, and electronics nearby. To preserve optical access while also facilitating thermal stability, the diamond may be mounted to a transparent optical substrate with high thermal conductivity, such as sapphire, silicon carbide, or an additional diamond with low NV center content.
11. The magnetic bias field may be generated with one or more electromagnets, oriented in one or more directions, to enable rapid adjustment of the magnetic field strength and direction. An electromagnet with low inductance may be used for applying time-varying magnetic fields to probe the time-dependent magnetic response of the particles under study. A time-varying bias magnetic field can also be used to separate the induced response from the contributions induced by other unknown or uncontrolled magnetic fields.
12. The magnetic bias field may be generated with one or more permanent magnets, which can provide fields well over 1,000 G with very little fluctuation over rapid time scales similar to the imaging rate. The magnetic bias field can be adjusted by moving permanent magnets with respect to the diamond sensor. Permanent magnets may also be used in combination with electromagnets.

Image Data Processing for Magnetic Image Acquisition

As described above, the magnetic image is constructed from raw data in the form of a stack of images of NV center fluorescence, with each image in the stack corresponding to a different microwave frequency. The values of a given pixel in the field of view across the image set constitute an ESR spectrum of the NV centers corresponding to that pixel. The magnetic image results from determining the local magnetic field at each pixel from that pixel's ESR spectrum.

Computing the local magnetic field from the ESR spectrum at an individual pixel involves two steps: (A) determine the frequencies of one or more ESR peaks in the spectrum; and then (B) compute the magnetic field based on the frequencies of the observed ESR peaks.

The first step, determining peak locations in the ESR spectrum, makes use of a model for how many peaks are expected and the shapes of the peaks. The simplest approach involves observation of a single peak. This approach can also be generalized to address additional peaks, either within a single narrow frequency range or in discrete, separated ranges. Various algorithms may be employed to quantify the location of one or more peaks from the spectral data. For example, nonlinear fitting to a model function is a highly general approach that can incorporate many parameters to describe all peaks in the ESR spectrum, including peak amplitude, width, and shape.

Once the peak locations are determined, the second step uses these locations to compute the magnetic field. Depending on how many ESR peaks are measured and which NV center orientations they correspond to, the full vector magnetic field may be determined, or only its projection onto one or more spatial axes.

Measurements that provide locations for multiple ESR peaks may also allow for measurement of peak shifts due to crystal strain or temperature, in order to correct for their effect on the magnetic field measurement. In particular, ESR transitions corresponding to opposite transitions in the NV center spin projection quantum number, $m_s$, (that is, transitions of the form $\Delta m_s=+1$ and $\Delta m_s=-1$) shift differently in response to magnetic fields than in response to strain, temperature, or electric fields. Measuring both $\Delta m_s=+1$ and $\Delta m_s=-1$ ESR transitions thus allows for quantification of magnetic fields separately from these effects.

Magnetic imaging is possible using bias magnetic field smaller than 10 G by employing circularly-polarized microwave fields to distinguish between $\Delta m_s=+1$ and $\Delta m_s=-1$ transitions, since each transition can only be driven by a field of the correct circular polarization. If the bias field is aligned to project equally on all four NV center axes, then parallel components of the magnetic field from the sample under test will shift $\Delta m_s=+1$ and $\Delta m_s=-1$ transitions in opposite directions. Separate measurements of the $\Delta m_s=+1$ and $\Delta m_s=-1$ transitions—each acquired using the appropriate circular microwave polarization—may be compared to determine the sample's magnetic field. This method may be employed even if ESR transitions cannot be clearly resolved from one another.

Fluctuations in optical excitation intensity or in backgrounds of non-signal light may be mitigated by common signal modulation techniques. In one embodiment, NV center fluorescence images may be acquired in a regular series of signal and null images, where the null images are acquired with the microwave drive field switched off or its frequency shifted far off resonance. Subtracting or dividing the null images from the signal images may control for drifts that occur more slowly than the switching frequency. In another embodiment, the signal may be modulated at higher frequency and a lock-in camera may be used to image only the component of image light that occurs at the modulation frequency.

Alternate Solid-State Defects

In addition to NV centers in diamond, other solid-state defects with electronic spin may be employed for high-resolution magnetic imaging for magnetic particle analysis using similar means as described here. Exemplary systems include the divacancy and silicon vacancy defects in different polytypes of silicon carbide, which have electronic spin $S>\frac{1}{2}$ and therefore are sensitive both to the magnitude and direction of an applied magnetic field. Solid-state defects that may be optically polarized and probed may be employed in similar manner as described above for NV centers, although with appropriately chosen wavelength of excitation light and frequency band of microwave or radiofrequency driving field. Single-crystal silicon carbide may be produced at wafer scale with high purity and optical transmission, which may allow for reduced cost and complexity in manufacturing magnetic imaging sensors.

Magnetic Image Analysis

Various metrics can be constructed to quantify each magnetic image for comparison over a set of many images. In each case, the metric may be calculated for a subset of the magnetic image containing a single magnetic object, or a multi-object metric can be constructed to analyze groups of objects collectively. Some example metrics are given below:

1. The magnetic image can be compared with a nonlinear fitting algorithm to the calculated magnetic field profile of a point dipole. Fit parameters such as dipole magnitude and direction can be extracted.
2. Where the shape of the particle's magnetic field is expected to remain constant, but vary in amplitude or direction, simple metrics will proportional or approximately proportional to the particle magnetization. These include:
   a. The maximum or minimum value of the particle's magnetic field
   b. The mean or standard deviation of the particle's magnetic field
   c. The maximum magnitude or mean magnitude of the particle's magnetic field gradient
   d. The maximum value of the image that results from convolving the particle's magnetic field image subset with an expected magnetic field profile.
3. The orientation of the particle's magnetization can be determined by analyzing deviations of the particle's magnetic field profile from an expected shape. Such deviations include:
   a. The relative magnitude of the maximum and minimum values of the particle's magnetic field.
   b. The relative pixel locations of the maximum and minimum values of the particle's magnetic field.
   c. The orientation of the particle's magnetic field gradient at the point where this gradient is at its maximum.

Different metrics can provide different magnetic information. For example, magnetization dipole magnitude may correlate with the quantity of magnetic material present; dipole direction may correlate with the remanent magnetization of the particle, the direction of which may differ from the bias field direction; and the spatial scale of the dipole field may correlate with the separation distance from the NV centers in the diamond and the magnetic material.

Computer System

Figure 10:
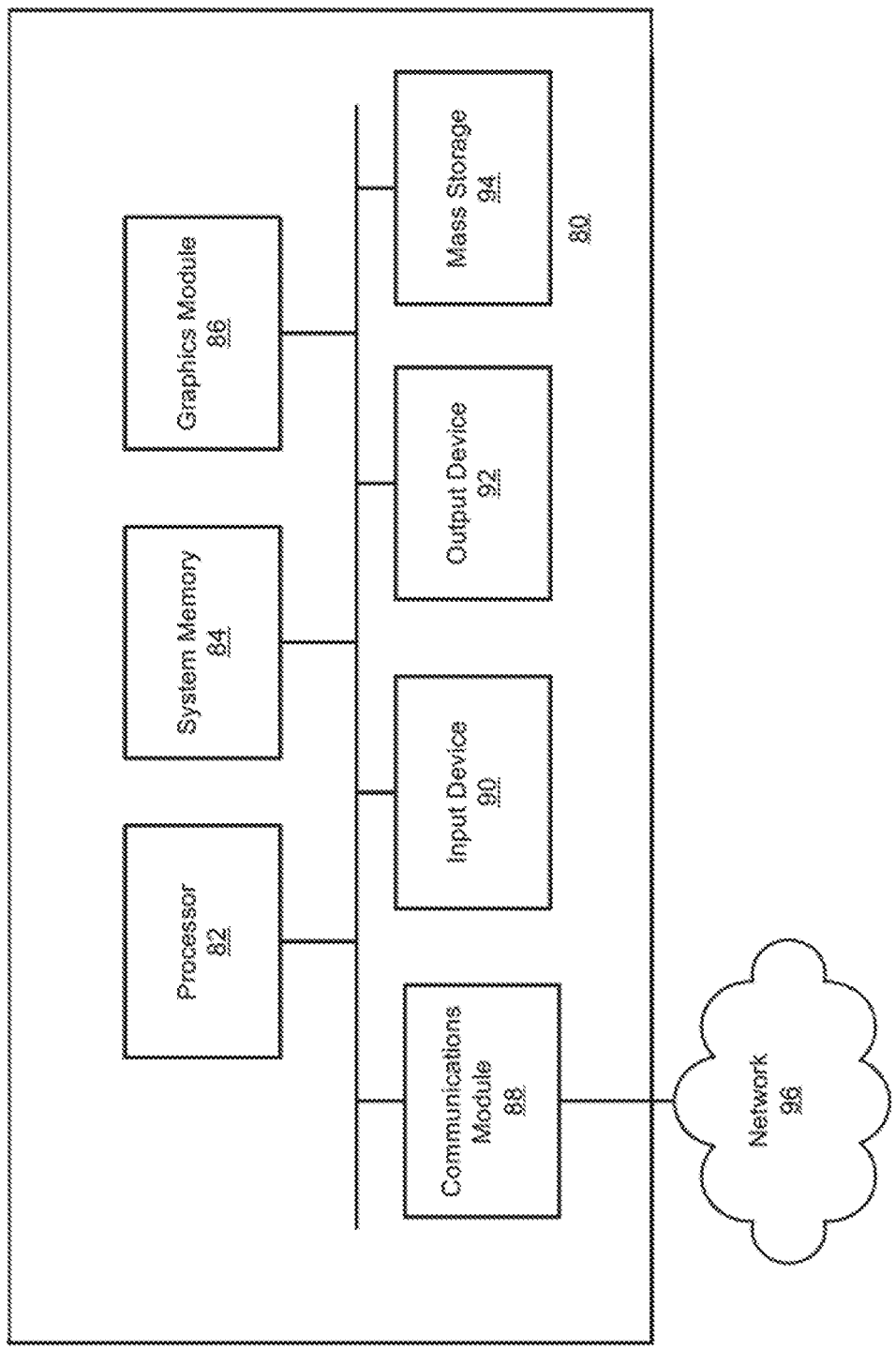
FIG. 10 schematically illustrates an exemplary computer system used for magnetic particle analysis in accordance with one or more embodiments.

The image data processing and magnetic image analysis described herein may be implemented in one or more computer programs executing on a programmable computer system. FIG. 10 is a simplified block diagram illustrating an exemplary computer system 80, on which the computer programs may operate as a set of computer instructions. The computer system 80 includes at least one computer processor 82, system memory 84 (including a random access memory and a read-only memory) readable by the processor 82. The computer system 80 also includes a mass storage device 94 (e.g., a hard disk drive, a solid-state storage device, an optical disk device, etc.). The computer processor 82 is capable of processing instructions stored in the system memory or mass storage device. The computer system additionally includes input/output devices 90, 92 (e.g., a display, keyboard, pointer device, etc.), a graphics module 86 for generating graphical objects, and a communication module or network interface 88, which manages communication with other devices via telecommunications and other networks 96. The computer system 80 additionally includes a hardware interface for acquisition of image data from a camera.

Each computer program can be a set of instructions or program code in a code module resident in the random access memory of the computer system. Until required by the computer system, the set of instructions may be stored in the mass storage device or on another computer system and downloaded via the Internet or other network.

EQUIVALENTS

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments.

Additionally, elements and components described herein may be further divided into additional components or joined together to form fewer components for performing the same functions. For example, the computer system may comprise one or more physical machines, or virtual machines running on one or more physical machines. In addition, the computer system may comprise a cluster of computers or numerous distributed computers that are connected by the Internet or another network, and may include various forms of specialized hardware for purposes of computational acceleration.

Accordingly, the foregoing description and attached drawings are by way of example only, and are not intended to be limiting.

What is claimed is:

1. A method of determining properties of magnetic particles using wide-field diamond magnetic imaging, comprising the steps of:
   (a) generating a set of magnetic images of a plurality of magnetic particles positioned on a sensing surface of a diamond sensor under different magnetic conditions created by reversing the direction of an externally-applied magnetic field applied to the magnetic particles; and
   (b) analyzing the set of magnetic images to measure single-particle magnetization along single-axis magnetization curves to infer magnetic properties including magnetic remanence of individual magnetic particles in the plurality of magnetic particles.

2. The method of claim 1, wherein step (a) comprises:
   (1) illuminating nitrogen-vacancy (NV) centers in the sensing surface with green light;
   (2) applying a microwave field to the sensing surface with frequency near one of the NV center electronic spin resonance (ESR) transitions;
   (3) acquiring an image of NV center fluorescence emitted from the sensing surface;
   (4) repeating steps (2) and (3) a plurality of times using different microwave frequencies that span one or more ranges around one or more NV center ESR transitions to generate the set of magnetic images, each corresponding to a different microwave frequency.

3. The method of claim 2, further comprising:
(5) repeating steps (2)-(4) a plurality of times and averaging the results to reduce imaging noise in the set of images.

4. The method of claim 1, wherein step (a) comprises:
(1) acquiring a set of NV center fluorescence images of the magnetic particles positioned on the sensing surface;
(2) constructing an electronic spin resonance (ESR) spectrum for each image pixel in the set of NV center fluorescence images;
(3) analyzing the ESR spectrum for each image pixel to determine the frequencies of one or more ESR transitions;
(4) computing the magnitude and/or direction of the magnetic field for each image pixel based on the frequencies of observed ESR transitions at that pixel to produce a magnetic image from the set of NV center fluorescence images; and
(5) repeating steps (1)-(4) to produce each magnetic image in the set of magnetic images.

5. The method of claim 1, wherein the single-particle single-axis magnetization curves are utilized to determine magnetic susceptibility, saturation magnetization, remanent magnetization, and/or magnetic coercivity of the individual magnetic particles.

6. The method of claim 1, further comprising measuring single-axis magnetization curves along additional axes to probe anisotropy of the single-particle single-axis magnetization curves.

7. The method of claim 6, wherein magnetization along one axis is measured while the magnetic field is applied parallel to another axis.

8. The method of claim 1, wherein step (a) comprises alternating or rotating the externally-applied magnetic field to create the different magnetic conditions to induce time-varying particle magnetization.

9. The method of claim 1, wherein the magnetic properties of individual magnetic particles comprise a superposition of multiple magnetic components or phases.

10. The method of claim 1, wherein the magnetic properties include thermal variation or the Curie temperature of the magnetic particles.

11. A system for determining properties of magnetic particles, comprising:
a wide-field diamond magnetic imaging apparatus for generating a set of magnetic images of a plurality of magnetic particles under different magnetic conditions, the apparatus including:
a) a diamond imaging sensor with a sensing surface containing a layer of diamond nitrogen-vacancy (NV) centers on which the magnetic particles are positioned;
b) a source of excitation light for inducing NV center fluorescence at the sensing surface;
c) at least one magnet for applying a bias magnetic field on the magnetic particles, wherein the at least one magnet can be moved relative to the sensing surface to create the different magnetic conditions by reversing the direction of a magnetizing field applied to the magnetic particles;
d) a microwave source for applying a microwave field to the sensing surface; and
e) an optical imaging system having an imaging sensor to image the NV center fluorescence from the sensor surface, the optical imaging system including an objective lens and a second lens focusing image light onto the imaging sensor; and
a computer system operatively coupled to the wide-field diamond magnetic imaging apparatus for analyzing the set of magnetic images to infer magnetic properties including magnetic remanence of individual magnetic particles in the plurality of magnetic particles.

12. The system of claim 11, wherein the layer of diamond NV centers has a thickness of about 10 nm to 10 µm.

13. The system of claim 11, wherein the layer of diamond NV centers has an NV center concentration of about 1-100 ppm.

14. The system of claim 11, wherein the excitation light comprises laser light near 532-nm wavelength.

15. The system of claim 11, wherein the excitation light has an intensity near 1 W/mm^2.

16. The system of claim 11, wherein the excitation light has an intensity between 0.01 W/mm^2 and 100 W/mm^2.

17. The system of claim 11, wherein the objective lens has a numerical aperture of at least 0.5.

18. The system of claim 11, wherein the optical imaging system includes an optical filter for blocking background and excitation light and passing NV fluorescence near 650-800 nm.

19. The system of claim 11, wherein the bias magnetic field has a magnitude of at least 10 G.

20. The system of claim 11, wherein the microwave field is resonant with one or more NV center electronic spin resonance (ESR) transitions.

21. The system of claim 11, further comprising angled optical interfaces for directing the excitation light into the sensing surface at an angle resulting in total internal reflection (TIR) at the sensing surface.

22. The system of claim 11, wherein the sensing surface is mounted on a thermally conductive transparent optical substrate.

23. The system of claim 11, wherein the at least one magnet for applying a bias magnetic field comprises one or more electromagnets that can be oriented in a selected direction, enabling adjustment of the magnetic field strength and direction.

24. The system of claim 11, wherein the at least one magnet for applying a bias magnetic field comprises one or more permanent magnets that can be moved relative to the sensing surface to enable adjustment of the magnetic field strength and direction.

25. A method of determining properties of magnetic particles using wide-field diamond magnetic imaging, comprising the steps of:
(a) generating a set of magnetic images of a plurality of magnetic particles positioned on a sensing surface of a diamond sensor under different magnetic conditions created by reversing the direction of a magnetizing field applied to the magnetic particles; and
(b) analyzing the set of magnetic images to determine magnetic susceptibility, saturation magnetization, remanent magnetization, and/or magnetic coercivity of individual magnetic particles in the plurality of magnetic particles.

* * * * *